US006542018B1

(12) United States Patent
Yin

(10) Patent No.: US 6,542,018 B1
(45) Date of Patent: Apr. 1, 2003

(54) CURRENT MODE STEP ATTENUATION CONTROL CIRCUIT WITH DIGITAL TECHNOLOGY

(75) Inventor: Dengqing Yin, Guangdong (CN)

(73) Assignee: Huawei Technologies Co., Ltd., Guangdong (CN)

(*) Notice: Subject to any disclaimer, the term of this patent is extended or adjusted under 35 U.S.C. 154(b) by 0 days.

(21) Appl. No.: 10/206,560

(22) Filed: Jul. 26, 2002

Related U.S. Application Data

(63) Continuation of application No. PCT/CN01/00097, filed on Jan. 22, 2001.

(30) Foreign Application Priority Data

Jan. 26, 2000 (CN) .......................................... 00101594

(51) Int. Cl.$^7$ ................................................ H03L 5/00
(52) U.S. Cl. ......................... 327/308; 327/322; 327/323
(58) Field of Search ................................ 327/308, 306, 327/318, 323, 324, 328, 322; 333/81 R

(56) References Cited

U.S. PATENT DOCUMENTS

| | | | | |
|---|---|---|---|---|
| 5,006,735 A | * | 4/1991 | Taylor ......................... 327/308 |
| 5,281,928 A | * | 1/1994 | Ravid et al. ............... 333/81 R |
| 5,440,280 A | * | 8/1995 | Lord ......................... 333/81 R |
| 5,442,352 A | | 8/1995 | Jackson | |
| 5,448,207 A | * | 9/1995 | Kohama .................... 333/81 R |
| 5,475,331 A | | 12/1995 | Bult et al. | |
| 6,060,933 A | * | 5/2000 | Jordan et al. ............... 327/308 |
| 6,229,375 B1 | * | 5/2001 | Koen ......................... 327/308 |

* cited by examiner

Primary Examiner—Toan Tran
(74) Attorney, Agent, or Firm—Alston & Bird LLP

(57) ABSTRACT

A current mode step attenuation control circuit with digital technology. The circuit includes several stages of serially connected current attenuation circuits, each having a digital control input port, common mode feedback signal input port and bias input port, which are connected to corresponding a digital control signal, a common mode feedback current and a bias voltage, respectively. An analog input signal inputted to the circuit is controlled by the digital control signal to implement step attenuation. By using the conducting resistance of a MOS transistor to form equivalent resistance or match of current source for attenuation, the circuit eliminates dependence on resistance match of conventional technology. Because step attenuation is directly controlled by a digital control signal, the transmission speed is fast, phase delay is small, control accuracy is high and the device is suitable for digital integrated circuit manufacturing technology.

19 Claims, 8 Drawing Sheets

CURRENT MODE STEP ATTENUATION CONTROL CIRCUIT WITH DIGITAL TECHNOLOGY

CROSS-REFERENCE TO RELATED APPLICATIONS

This is a continuation application of PCT/CN01/00097, filed Jan. 22, 2001, which is incorporated herein by reference in its entirety, and also claims the benefit of Chinese Patent Application No. 00101594.X, filed Jan. 26, 2000.

FIELD OF THE INVENTION

The present invention relates generally to an interface integrated circuit for data communication, and more particularly to a current mode step attenuation control circuit with digital technology.

BACKGROUND OF THE INVENTION

Voltage attenuation control has an important role in signal processing circuit with Digital Signal Process (DSP) as a kernel. At a signal input, when the signal amplitude is too large and modulation attenuation occurs, amplitude limit distortion will be lowered and accuracy of signal processing will be raised. At signal output, when signal amplitude is too large, attenuation will lower interference to adjacent channel and raise the whole system performance. Referring to FIG. 1, a conventional voltage attenuation circuit is consisted of one operational amplifier and two variable resistors, wherein $V_{in}$ is an input voltage signal, $V_{bias}$ is a DC bias voltage, $V_{out}$ is an output voltage signal and variable resistors R1 and R2 are used to adjust gain. Suppose signal $V_{in}$ has an AC component (VAC) and a DC component (VDC), and the VDC equals to a bias voltage of the operational amplifier, then the operational amplifier is an ideal amplifier and there is a formula $$V_{out} = (V_{bias} - V_{in})\frac{R1}{R2} = (V_{DC} - V_{DC} - V_{AC})\frac{R1}{R1} = -V_{AC}\frac{R1}{R2}$$

It can be seen from the formula above that output voltage has a linear relationship with resistance ratio of variable resistors R1 and R2, but the polarity is opposite to the input signal. By changing resistance of R1 and R2, step voltage attenuation control can be implemented. In general, changing R2 resistance is an easier way to attenuate by digital signal control, but when attenuation amplitude is large, connected larger resistance R2 will cause larger noise. In this attenuation circuit which is consisted of resistors, some elements, such as MOS switch etc., work at nonlinear zone and there are conducting resistances, so the attenuation circuit must have larger resistance of R2, otherwise control accuracy is worse. As there are larger resistances, the attenuation circuit cannot be integrated by standard digital integrated circuit technology.

Another weakness of the attenuation circuit is that in a single power supply system, such as a single-positive power supply, the bias voltage setting is limited. In the formula $V_{bias}$>abs($V_{in}$)+K, wherein function abs means taking a variable absolute value, K is the minimum setting value of DC bias voltage which is limited by output amplitude range of the operational amplifier. When two inputs of the operational amplifier are equal, output should be zero. Nevertheless, if output amplitude range is 0.5V . . . VCC− 0.5(V), when two inputs are equal, according to attenuation setting the output should be 0.5V. Otherwise, in certain signal input range, output will have larger distortion, which comes from non-ideal working state of the operational amplifier.

The output of the attenuation circuit only have AC signal and partial DC component, so it cannot provide DC working point for successive circuit, i.e. it cannot be directly coupled with successive circuit. In order to provide ideal DC working point and to implement direct couple, a differential operational amplifier is used in general, which uses Common Mode Feed Back (CMFB) circuit to create DC working point for successive circuit. FIG. 2 shows a step attenuation circuit controlled by 5 bits digital signal.

In FIG. 2, $V_{inP}$ and $V_{inN}$ are two complement input voltage signals, $V_{outP}$ and $V_{outN}$ are two complement output voltage signals too, b0~b4 are five levels digital signal for step attenuation control. The 2 to 4 decoder decodes 2 Most Signification Bits (2MSB) of the digital signal. The outputs of 2 to 4 decoder are IN0~IN3 which control cut-in or cut-off of full differential operational amplifier input switches: SW1P and SW1N, SW2P and SW2N, SW3P and SW3N, SW4P and SW4N, respectively. The 3 to 8 decoder decodes 3 Lowest Signification Bits (3LSB) of the digital signal. The outputs of 3 to 8 decoder are OUT0, OUT1, . . . OUT7 which control cut-in and cut-off of full differential operational amplifier output switches: SWO1P and SWO1N, SWO2P and SWO2N, . . . SWO7P and SWO7N, SWO8P and SWO8N, respectively. The VDC is a needed DC component of output differential signal, $CMFB_{in}$ is the input of CMFB, and $CMFB_{out}$ is the output of CMFB.

The voltage attenuation control in circuit above is in segment, i.e. with 2MSB decoder, the control is divided into four segments and each 8 DB is a control segment. When a digital control signal input is b4b3b2b1b0=00000; in input part, switches SW1P and SW1N are cut off and others are cut in, so resistances R1P and R1N are cut in and other resistances are all shorted; in output part, all switches are cut off and all resistances are cut in; at this time voltage attenuation is 0 DB, the output is $$V_{outP} = -V_{inN} * \frac{\sum_{m=1}^{m=8} RO(m)P}{RIN} \qquad V_{outN} = -V_{inP} * \frac{\sum_{m=1}^{m=8} RO(m)N}{RIP}$$

In these two formulas, when all cuts (decreasing) in resistances in output equal to cutting in resistances in input, then attenuation is 0 DB, but signal polarity is opposite. When keeping 2MSB unchanged, but b2b1b0 has been changed from 000 to 111, cutting in resistances, in input, have been kept unchanged and cutting in resistances, in output, have been changed from 8 items to 1 item. The attenuation is changed from 0 DB to −7 DB. When 2MSB has been changed from 00 to 11 one by one, in input, cutting in resistances have been changed from 1 item to 4 items, and four segments of control are sequentially performed.

The numerical expressions corresponding to a digital control signal is m=2*b4+b3 n=4*b2+2*b1+b0

For different inputs of a digital control signal, the attenuation is $$\frac{V_{outP}}{V_{inN}} = -\frac{\sum_{K=1}^{K=8-n} RO(K)P}{\sum_{L=0}^{L=m} R(1+L)N} \qquad \frac{V_{outN}}{V_{inP}} = -\frac{\sum_{K=1}^{K=8-n} RO(K)N}{\sum_{L=0}^{L=m} R(1+L)P}$$

Wherein m is a decimal number corresponding to 2MSB of a binary digital control signal, and n is a decimal number corresponding to 3LSB of a binary digital control signal. A calculated number n is used in attenuation calculation formulas to sum the corresponding cut in resistances in numerator and denominator.

It can be seen from the analysis above that a whole circuit voltage attenuation can be calculated as follow. First, calculate decimal number m and n with a digital control signal input. Then, sum resistances of cut in circuits to obtain input summed resistance and output summed resistance of a cut in circuit. Finally, with the attenuation calculating formulas mention above calculate voltage attenuation of corresponding digital control signal.

MOS switch has a conducting resistance, said above, when considering switch conducting resistance, control accuracy of voltage attenuation will be affected. Taking 0 DB attenuation as an example, after considering the conducting resistance effect of MOS switch, a real attenuation is $$\frac{V_{outP}}{V_{inN}} = -\frac{\sum_{m=1}^{m=8} RO(m)P}{3*R_{SW(ON)}+RIN} \qquad \frac{V_{outN}}{V_{inP}} = -\frac{\sum_{m=1}^{m=8} RO(m)N}{3*R_{SW(ON)}+RIP}$$

In the formulas above, numerator is a total output resistance of cut in circuits and denominator is a total input resistance of cut in circuits. The attenuation calculating formula is similar as above, the only difference is by considering the MOS switch conducting resistance effect in the acting on input circuit resistance. When an output switch is also cut in the circuit, switch conducting resistance effect is also considered in corresponding numerator items. Because, at output, switches are parallel cut in, at most only one switch conducting resistance effect is considered, but, at input, switches are serially cut in, so at most it should consider conducting resistance effect for three switches.

In the circuit above, attenuation can be gradually increased in an equal step length for DB value, but for resistance of a cut-in circuit corresponding to the increasing DB value, the resistance is increased in an irregular way. Consequently, for twelve resistances in a cut-in circuit, each one has a different increased resistance. In resistance match, if ratio of two matched resistances is a integer, especially 1, 2, 4, 8, . . . , the match performance are best. Therefore, for resistances match in a circuit, if there is a resistance match with non-integer proportional relationship, then implementation of layout is very difficult. Table 1 shows relationship between DB attenuation and real attenuation multiple.

TABLE 1

| DB attenuation | Real multiple |
|---|---|
| 0 | 1.00E + 00 |
| −1 | 8.91E − 01 |
| −2 | 7.94E − 01 |
| −3 | 7.08E − 01 |

TABLE 1-continued

| DB attenuation | Real multiple |
|---|---|
| −4 | 6.31E − 01 |
| −5 | 5.62E − 01 |
| −6 | 5.01E − 01 |
| −7 | 4.47E − 01 |
| −8 | 3.98E − 01 |
| −9 | 3.55E − 01 |
| −10 | 3.16E − 01 |
| −11 | 2.82E − 01 |
| −12 | 2.51E − 01 |
| −13 | 2.24E − 01 |
| −14 | 2.00E − 01 |
| −15 | 1.78E − 01 |
| −16 | 1.58E − 01 |
| −17 | 1.41E − 01 |
| −18 | 1.26E − 01 |
| −19 | 1.12E − 01 |
| −20 | 1.00E − 01 |
| −21 | 8.91E − 02 |
| −22 | 7.94E − 02 |
| −23 | 7.08E − 02 |
| −24 | 6.31E − 02 |
| −25 | 5.62E − 02 |
| −26 | 5.07E − 02 |
| −27 | 4.47E − 02 |
| −28 | 3.98E − 02 |
| −29 | 3.55E − 02 |
| −30 | 3.16E − 02 |
| −31 | 2.82E − 02 |

When attenuation is −1 DB, a resistance to be shorted is $RO8N(P)=(1.0-0.891)*R1P(N)=0.109R1P(N)$.

When attenuation is −2 DB, a resistance to be shorted is $RO7N(P)=(0.891-0.794)*R1P(N)=0.097R1P(N)$.

It is seen from analysis above, for equal DB step length attenuation, corresponding resistance varies are irregular, so resistance match is very difficult. Because cut in resistances in input are different for four segments, attenuation circuit designed with the method above can only have control accuracy of ±30%.

SUMMARY OF THE INVENTION

The invention provides a current mode step attenuation control circuit, which is suitable for Application Specific Integrated Circuit (ASIC) manufacturing technology and has high control accuracy. It takes advantage of large digital integrated circuit technology for digital communication interface, based on DSP.

A current mode step attenuation control circuit comprises several stages of current attenuation circuits connected serially. Each stage of the current attenuation circuit has a digital control input, a common mode feedback signal input and a bias input which are connected to a digital control signal, a common mode feedback current and a bias voltage, respectively. An analog input signal is connected to input of the first stage current attenuation circuit. The circuit attenuation stage design is based on binary weighted match. The step length is set according to necessity, and the attenuation is directly controlled by a digital signal, i.e. it implements current mode step attenuation control without any decoder circuit.

The invention changes conventional voltage attenuation control to current attenuation control to solve step attenuation problem, which depends on resistances match in convention. The invention utilizes MOS transistor conducting resistance to form an equivalent resistance or current source match to control attenuation. By using transistor match to implement attenuation control, it eliminates thoroughly dependence on resistance match. It has advantages of high transmission speed, small phase delay, high control accuracy and compatible with digital integrated circuit technology. The current mode step attenuation control circuit can be integrated with DSP circuit in one chip to lower system cost and raise system reliability.

In conventional voltage attenuation mode, when voltage attenuation is different, influence and requirement for operational amplifier is different, in this case it is necessary to use different compensating technology, such as internal compensating capacitor with different values for different attenuation. In a circuit of the invention, because it is a current mode, requirement to operational amplifier is greatly decreased, so circuit design is simplified. Influence of conducting resistance of switches on attenuation control accuracy is effectively suppressed. From theoretical point of view, influence of a switch conducting resistance on attenuation accuracy can be neglected, so control accuracy is greatly increased.

The step attenuation control circuit includes several current attenuation stages. Design of attenuation stages is based on binary weighted match. Therefore, digital signal controls attenuation directly without assistance of any decoder circuit, and design complexity of the circuit is greatly simplified.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
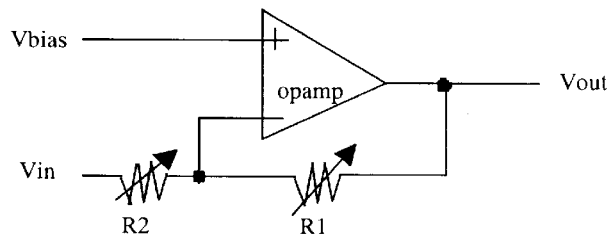
FIG. 1 is a conventional step attenuation control circuit diagram.
Figure 2:
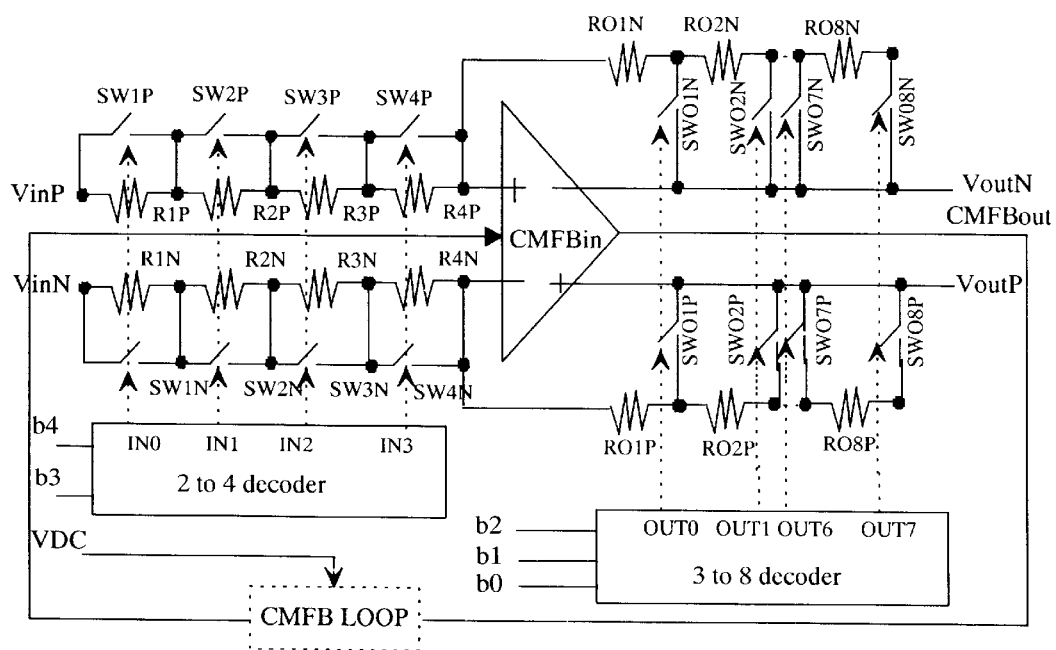
FIG. 2 is a simplified 0 to 31 DB step attenuation control circuit.
Figure 3:
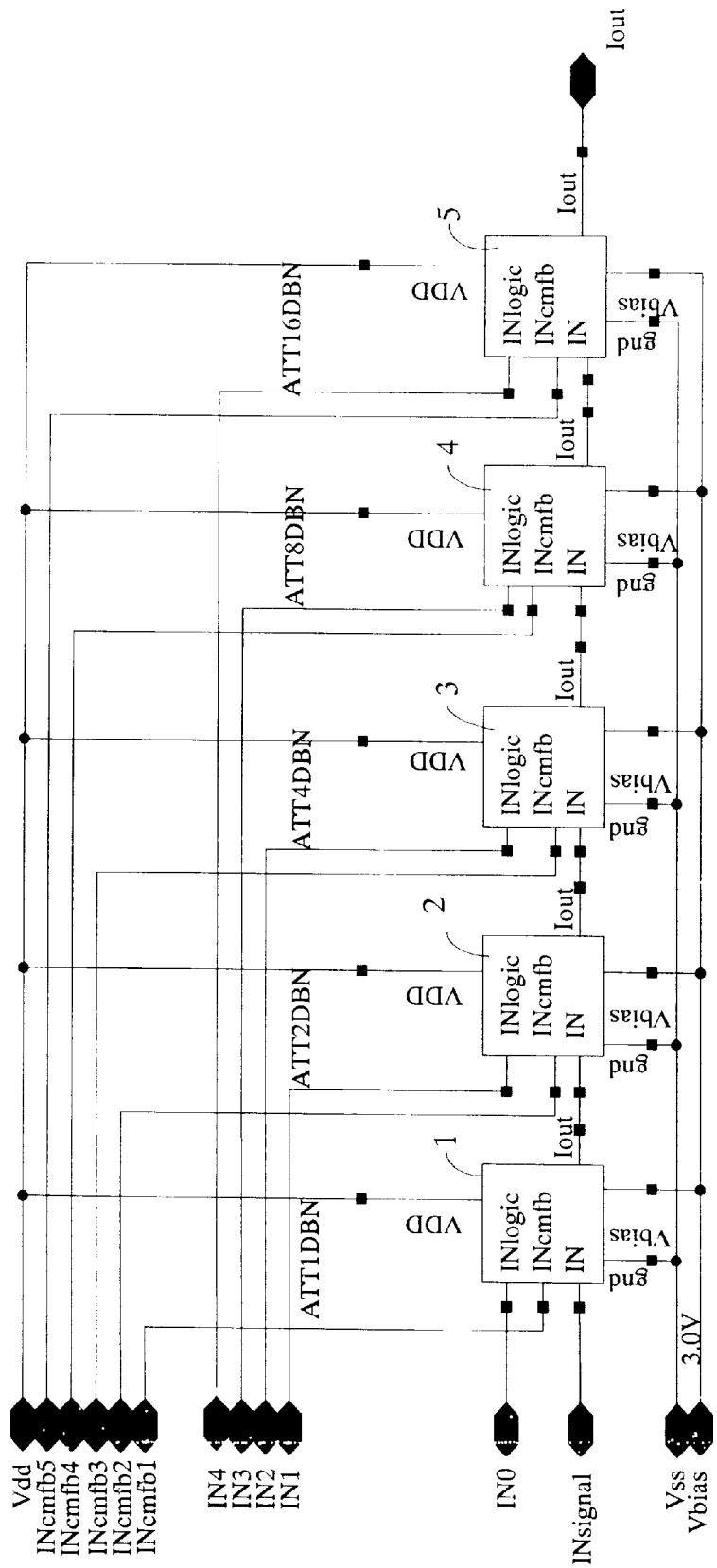
FIG. 3 is a block diagram of current mode step attenuation control of the invention.

FIG. 3 depicts a block diagram of the invention. The current mode step attenuation control circuit comprises five stages of current attenuation circuit (1, 2, 3, 4, 5): 1 DB, 2 DB, 4 DB, 8 DB and 16 DB. Digital control signals 1N1, 1N1, 1N2, 1N3, 1N4 are connected to control input of current attenuation circuits (1, 2, 3, 4, 5), respectively. Common Mode Feedback currents, Incmfb1 to Incomfb5, are connected to the CMFB current input of current attenuation circuits (1, 2, 3, 4, 5), respectively. Bias voltage of current attenuation circuits (1, 2, 3, 4, 5) are connected to a bias voltage Vbias. A power supply terminal and ground terminal of current attenuation circuits (1, 2, 3, 4, 5) are connected to power supply Vdd and ground Vss, respectively. An analog input signal INsignal is connected to input of the first stage current attenuation circuit (1). Current attenuation circuits (1, 2, 3, 4) output is connected to next stage input sequentially. Output signal Iout of fifth stage current attenuation circuit (5) is a final output current of the circuit. The circuit attenuation stages design is a binary weighted match with a 1 DB step, a digital control signal can control attenuation without decoder circuit, i.e. 31 DB step attenuation control can be implemented. When a digital control input is 00000, attenuation of five cascade attenuation control stages is all 0 DB, so a signal total attenuation is 0 DB. When input is 00001, 1 DB attenuation control stage is activated and attenuation of other control stages is 0 DB, so a signal total attenuation is 1 DB. When digital control input is 00010, attenuation control stage 2 DB is activated and attenuation of other attenuation control stages is 0 DB, so a signal total attenuation is 2 DB; and so on. When digital control signal is 10000, 16 DB attenuation control stage is activated and others are all 0 DB, so a signal total attenuation is 16 DB. When digital control signal is 11111, all attenuation control stages are activated, a signal total attenuation is 1+2+4+8+16=31 DB.

A step length of the step attenuation control circuit can be less than 1 DB, such as 0.5 DB, 0.25 DB etc. When a step length is 0.5 DB, six stages current attenuation circuit can be serially connected and digital signal controls attenuation directly, it implements 0 to 31.5 DB step attenuation control. In general, a step attenuation control circuit is consisted of two to six stages of current attenuation circuit connected serially. The current attenuation circuit has a digital control input, a CMFB current input, a bias voltage, an analogy signal input, an analogy signal output and a power supply.

A current attenuation circuit of the invention has several embodiments, one of them uses MOS transistor conducting resistance to form an equivalent resistance for attenuation. By using MOS transistor conducting resistance directly, channel length modulated effect can be controlled. As input signal current can be either injecting current or pull-down current, it is designed two kinds of current attenuation circuits. In these two kinds of circuits, attenuation accuracy is decided by number of matching transistors and what positions they are located in the layout. In general, the control accuracy can be ±1%.

Figure 4:
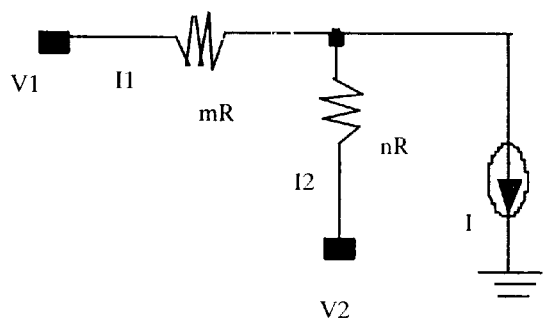
FIG. 4 is a topological principle diagram of equivalent resistance attenuation.

FIG. 4 shows topological principle of an equivalent resistance attenuation, wherein V1 and V2 are two bias voltages connecting points, I1 is a current passing through resistance mR, I2 is a current passing though resistance nR and the total current is I. Suppose two bais voltages are equal, i.e. V1=V2, then current I1 and current I2 only relates to proportion of resistance mR and nR; i.e.

$$I1 = \frac{n}{m+n} * I \qquad I2 = \frac{m}{m+n} * I$$

Suppose after attenuation a needed current is I1, then with careful design of resistances porportion m and n, a corresponding attenuation DB can be calculated. Table 2 shows the calculations when m and n take integer values.

TABLE 2

| DB attenuation value | Real attenuation value | m value | n value |
|---|---|---|---|
| −1 | 8.91E−01 | 1 | 9 |
| −2 | 7.94E−01 | 2 | 8 |
| −4 | 6.31E−01 | 9 | 16 |
| −8 | 3.98E−01 | 6 | 4 |
| −16 | 1.58E−01 | 21 | 4 |

Figure 6:
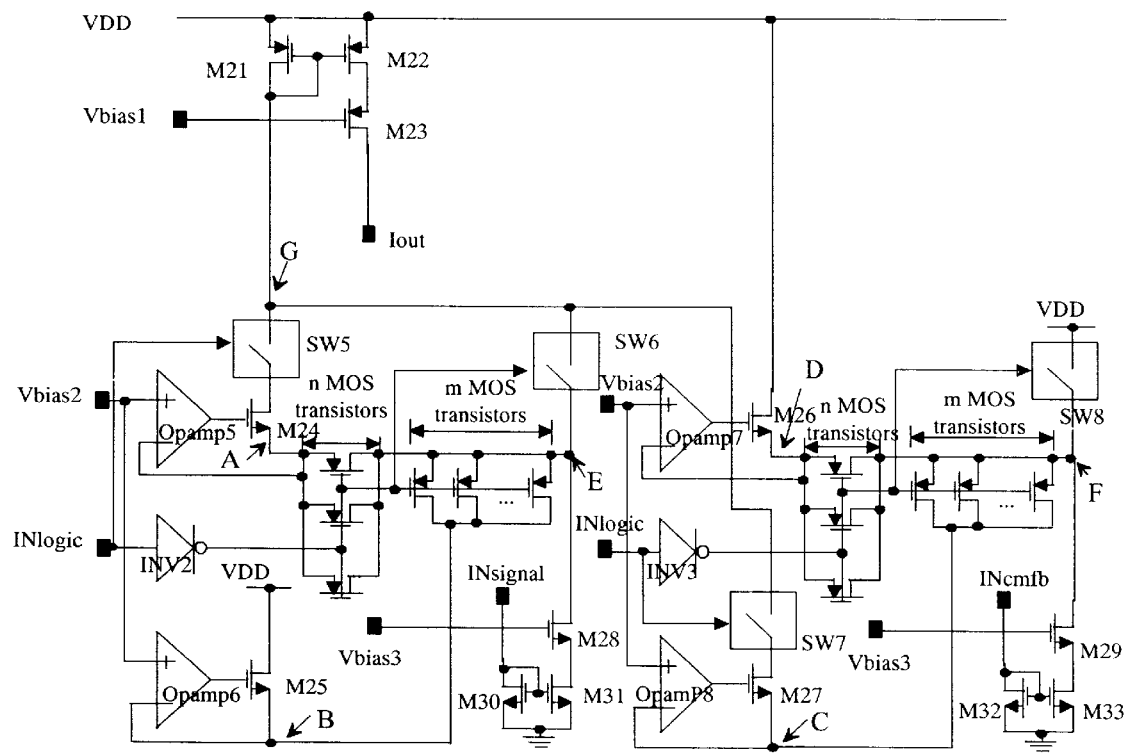
FIG. 6 is a pull-down current type current attenuation circuit diagram.

FIG. 6 is a pull-down current attenuation circuit. It contains: four operational amplifiers, two inverters, two sets of (m+n) long channel PMOS transistors used as equivalent resistance, four MOS switches (SW5 to SW8) and several MOS transistors. MOS transistor M24 and operational amplifier opamp5 constitute a first voltage follower. MOS transistor M25 and operational amplifier opamp6 constitute a second voltage follower. Source of MOS transistor M24 (contact A) is connected to source of a set of n parallel PMOS transistors, and drain of MOS transistor M24 is connected to one end of switch SW5. Source of MOS transistor M25 (contact B) is connected to drain of a set of m parallel PMOS transistors. Source of said m parallel PMOS transistors and drain of said n parallel PMOS transistors are connected to contact E. Grid of said m parallel PMOS transistors and grid of said n parallel PMOS transistors are connected to output of the inverter INV2. MOS transistors M30 and M31 constitute a current mirror, input of the current mirror is connected to the input signal INsignal and output of the current mirror is connected with the MOS transistor M28. Drain of the MOS transistor M28 is connected with one end of switch SW6 at contact E. Another end of switches SW5 and SW6 are all connected to input of the current mirror consisted of MOS transistors M21 and M22 at contact G. Output of the cascade transistor M23, it grid is connected to bias voltage Vbias1, is connected to output of the MOS transistor M22. Input of the inverter INV2 and control end of the switch SW5 are connected to digital control signal INlogic, and output of the inverter INV2 is connected to control end of the switch SW6.

MOS transistor M26 and operational amplifier opamp7 constitute a third voltage follower, and MOS transistor M27 and operational amplifier opamp8 constitute a fourth voltage follower. Source (contact D) of the MOS transistor M26 is connected to source of another set of n parallel PMOS transistors. Drain of the MOS transistor M26 is connected to power supply VDD. Source (contact C) of the MOS transistor M27 is connected to drain electrode of another set of m parallel PMOS transistors. The SW7 is connected between drain of the M27 and contact G. Source of said m parallel PMOS transistors and drain of said n parallel PMOS transistors are connected to contact F. Grid of said m parallel PMOS transistors, and grid of said n parallel PMOS transistors, and control end of switch SW8 are all connected to output of inverter INV3. Input of current mirror, consisted of MOS transistors M32 and M33, is connected to the common mode signal INcmfb, and output cascade transistor of the current mirror is MOS transistor M29. Drain of the MOS transistor M29 and one end of switch SW8 are connected to contact F. Input of the inverter INV3 and control end of the switch SW7 are connected to the digital control signal INlogic. Input with phase coincidence of said four operational amplifiers are all connected to bias voltage Vbias2, and grid of MOS transistors M28 and M29 is connected to bias voltage Vbias3.

In FIG. 6, VDD is a power supply. Vbias1 and Vbias3 are biases of CASCADE stage (a cascade, hereinafter, known as CASCADE), used to decrease channel length modulation effect of a MOS transistor. Vbias2 is an externally added bias, used for DC bias of an equivalent resistance. INlogic is a digital control signal for controlling step attenuation, INsignal is an input signal to be attenuated, INcmfb is a CMFB current input and Iout is a current output.

As mentioned above, four operational amplifiers and MOS transistors M24 to M27 constitute four voltage followers, respectively, contacts A, B, C, D are all connected to Vbias2. At the contact E, a pull-down current is INsignal; at the contact F, a pull-down current is INcmfb. The MOS transistors M28 and M29 constitute respective cascade stage of two current mirrors. MOS transistors M21 and M22, M30 and M31, M32 and M33 constitute respective current mirrors. Output current and input current of a current mirror is proportional. When control signal is 1, current flow direction control switches SW5 to SW8 are cut in, and when control signal is 0, current flow direction control switches SW5 to SW8 are cut off. Suppose DC component of the input signal current equals to the CMFB current, then $$I_{INsignal} = I_{INcmfb} + I_{AC}$$

Wherein, $I_{INsignal}$ is current of the input signal, $I_{INcmfb}$ is CMFB current (equals to the DC component of input signal current, $I_{AC}$ is AC component of the input signal current. The contact G is a current collecting point, $$I_{out} = I(G)$$

Wherein $I_{out}$ is an output current, $I(G)$ is an input current of the current mirror M21 and M22 at the contact G.

When the digital control signal INlogic is 0, switches SW6 and SW8 are cut in, and SW5 and SW7 are cut off, so $$I_{out} = I_{INsignal}$$

At this moment, the input current equals to the output current, so current attenuation is 0 DB.

When the digital control signal INlogic is 1, switches SW5 and SW7 are cut in, and SW6 and SW8 are cut off, so there is $$I_{out} = \frac{n}{m+n} * I_{INsignal} + \frac{m}{m+n} * I_{INcmfb} = \frac{n}{m+n} * I_{AC} + I_{INcmfb} = \frac{n}{m+n} * I_{AC} + I_{DC}$$

It can be seen from the analysis above, in the attenuation circuit, AC component of a signal to be attenuated is attenuated and DC component of the signal is unchanged. Therefore, when implementing step attenuation, it provides successive stages a stable DC working point at the same time, and makes sure that it can couple directly with a successive stage circuit.

In the circuit above, by using different number of MOS transistors, signal step attenuation control is implemented. Because of channel length modulation effect of MOS transistor, it must be careful for channel length design of m and n parallel MOS transistors; in general, taking W/L=20/10 is enough.

In the circuit, control accuracy mainly depends on (1) match of m MOS transistors and n MOS transistors; (2) an offset voltage of operational amplifier (hereinafter, known as OFFSET). OFFSET of operational amplifier is related to integrated circuit manufacture technology, at present it is about 2 mV. Match of MOS transistors can be solved by increasing MOS transistor area.

Suppose the match accuracy of MOS transistors is higher and it can be neglected, an error is $$\Delta I = \frac{2mV}{R_{MOS(ON)}}$$

It is seen from the formula above that deviation current during step control is a ratio of an operational amplifier OFFSET voltage and a MOS transistor conducting resistance used as equivalent resistance. Therefore, increasing channel length of MOS transistor can increase transistor conducting resistance to increase step control accuracy. When total parallel resistance is 2K ohm, maximum deviation current is 1 uA; this means that when $I_{INsignal}$ is 100 uA, step control accuracy is 1%.

Because control accuracy relates to MOS transistors match accuracy; so for MOS transistors match when m or n has a smaller value, they can be increased with same proportion to utilize manufacture technology for raising step control accuracy.

Corresponding relationship between number of said long channel PMOS transistors m, n, which are used for equivalent resistance, and DB attenuation value are as follow: when m takes 1 and n takes 9, DB attenuation value is −1; when m takes 2 and n takes 8, DB attenuation value is −2; when m takes 9 and n takes 16, DB attenuation value is −4; when m takes 6 and n takes 4, DB attenuation value is −8; and when m takes 21 and n takes 4, DB attenuation value is −16.

During circuit working, after passing M30 and M31 current mirror, INsignal goes through cascade transistor M28 and enters contact E. When control signal is 0, signal current passes through SW6 and enters contact G without attenuation, then after passing through current mirror M21 and M22, it outputs from Iout terminal. When control signal is 1, signal current passes through equivalent resistance network, consisted of m PMOS transistors and n PMOS transistors; after attenuation, signal current enters the contact G through SW5, then attenuated signal current outputs from Iout terminal. A common mode signal is inputted from INcmfb, after passing current mirror M32 and M33, it enters the contact F through cascade transistor M29. When control signal is 0, it enters power supply through SW8. When control signal is 1, after passing through equivalent resistance network, consisted of (m+n) PMOS transistors, and attenuating, the common mode current enters contact C and contact G through switch SW7, then adds with the attenuated signal current.

Figure 7:
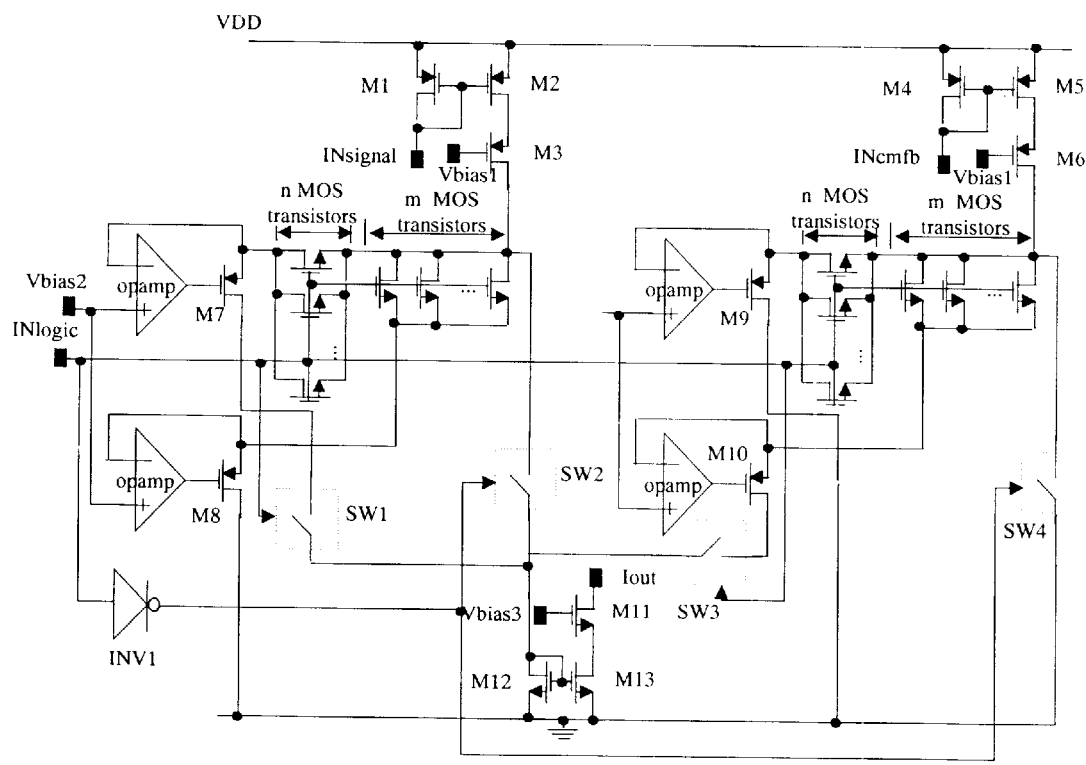
FIG. 7 is an injection current type current attenuation circuit diagram.

FIG. 7 shows an injection current attenuation circuit, which contains four operational amplifiers, one inverter, two sets of (m+n) long channel NMOS transistors used as equivalent resistance, four MOS switches (SW1 to SW4) and several MOS transistors. MOS transistor M7 and operational amplifier opamp1 constitute a first voltage follower, and MOS transistor M8 and operational amplifier opamp2 constitute a second voltage follower. Source and drain of MOS transistor M7 are connected to drains of a set of n parallel NMOS transistors and one end of switch SW1, respectively. Source of MOS transistor M8 is connected to sources of a set of m NMOS transistors, connected in parallel. Drains of said m NMOS transistors, sources of said n NMOS and switch SW2 are connected to drain of MOS transistor M3. Input of current mirror, consisted of MOS transistors M1 and M2, is connected to input signal INsignal, and output of the current mirror is cascaded to MOS transistor M3. One end of switches SW1, SW2 and SW3 is connected to input of current mirror, consisted of MOS transistors M12 and M13, and output of the current mirror is cascaded to MOS transistor M11. Control ends of switches SW1 and SW3, said inverter INV1 input, and grids of said m NMOS transistors and said n NMOS transistors are all connected to digital control signal INlogic. Output of inverter INV1 is connected to control ends of switches SW2 and SW4.

MOS transistor M9 and operational amplifier opamp3 constitute a third voltage follower, and MOS transistor M10 and operational amplifier opamp4 constitute a fourth voltage follower. Source of MOS transistor M9 is connected to drains of another set of n parallel NMOS transistors, and drain of MOS transistor M9 is connected to the ground. Source and drain of MOS transistor M10 are connected to sources of another set of m parallel NMOS transistors and another end of switch SW3, respectively. Grid of said m NMOS transistors and said n NMOS transistors are all connected to digital control signal INlogic. Input of current mirror, consisted of MOS transistors M4 and M5, is connected to common mode signal INcmfb, and output of the current mirror is cascaded to MOS transistor M6. Drain of MOS transistor M6, drain of said m NMOS transistors and source of said n NMOS transistors are all connected to one end of switch SW4, another end of switch SW4 is connected to the ground. Phase coincidence input terminal of said four operational amplifiers are all connected to bias voltage Vbias2, and grid of MOS transistors M3 and M6 are connected to bias voltage Vbias1.

In current injection scheme, there are different requirements for equivalent resistance implementations; when it is pull-down current, PMOS transistors are used; and when it is injection current, in general, NMOS transistors are used. An equivalent resistance implementation is also related to MOS transistor working state; in general, when MOS transistor equivalent resistance is working at a stable conducting state, the MOS transistor grid voltage VGS wants to be greater than 1.6V.

Corresponding relationship between number of said long channel NMOS transistor m, n and DB attenuation value is as follow: when m takes 1 and n takes 9, DB attenuation value is −1; when m takes 2 and n takes 8, DB attenuation value is −2; when m takes 9 and n takes 16, DB attenuation value is −4; when m takes 6 and n takes 4, DB attenuation value is −8; and when m takes 21 and n takes 4, DB attenuation value is −16.

In FIG. 7, INsignal is the signal current input, INcmfb is the CMFB current input, INlogic is the input of step attenuation digital control signal, Vbias1 and Vbias3 are the bias voltage inputs of CASCADE stage, Iout is the current output, and VDD is the power supply. Four switches SW1 to SW4 are cut in, when the corresponding digital control signal is 1; and the four switches SW1 to SW4 are cut off, when the digital control signal is 0.

Suppose working condition is same as pull-down current attenuation circuit said above, when INlogic is 0, $$I_{out} = I_{INsignal}$$

at this moment, the attenuation is 0 DB; and when INlogic is 1, $$I_{out} = \frac{n}{m+n} * I_{AC} + I_{DC}$$

at this moment, AC component is attenuated and DC component is unchanged.

In injection current circuit, m MOS transistors, in parallel, and n MOS transistors, in parallel, should be adjusted gently according to the necessary state; when their grid voltage is 3.3V and the drain voltage of MOS transistor M3 is at 1.7 to 1.4V, they can work at equivalent resistance zone. When the drain voltage is too high, it is possible that equivalent resistance does not conduct enough; and when the drain voltage of M3 is too low, there is a higher requirement to operational amplifiers performance.

Suppose voltage drop of equivalent resistance is 0.1V, then at grids of MOS transistors M7 and M8 and outputs of operational amplifiers, the output amplitude is 0.5~0.2V (corresponding to drain voltage of M3 is 1.7~1.4V). For an operational amplifier, under single power supply, when it output is 0.2~0.5V, it is working near it limit. It can be seen from the analysis above that designing correctly DC working point of every contact can raise system performance effectively, improve step control accuracy and decrease non-linear distortion.

Another current attenuation circuit implementation scheme of the invention is by using current sources match to attenuate. In this scheme, as attenuation error of current source mainly comes from channel length modulation effect of devices, so in the design by appropriate increase device length and adjusting device working area, attenuation error will be decreased effectively. At the same time, in circuit design for P trap and N trap technology, PMOS current attenuation circuit and NMOS current attenuation circuit are designed, respectively, in order to use different noise suppression ability of NMOS current source and PMOS current source. In principle, these two circuits are the same, only the polarity of signal attenuation is opposite.

Figure 8:
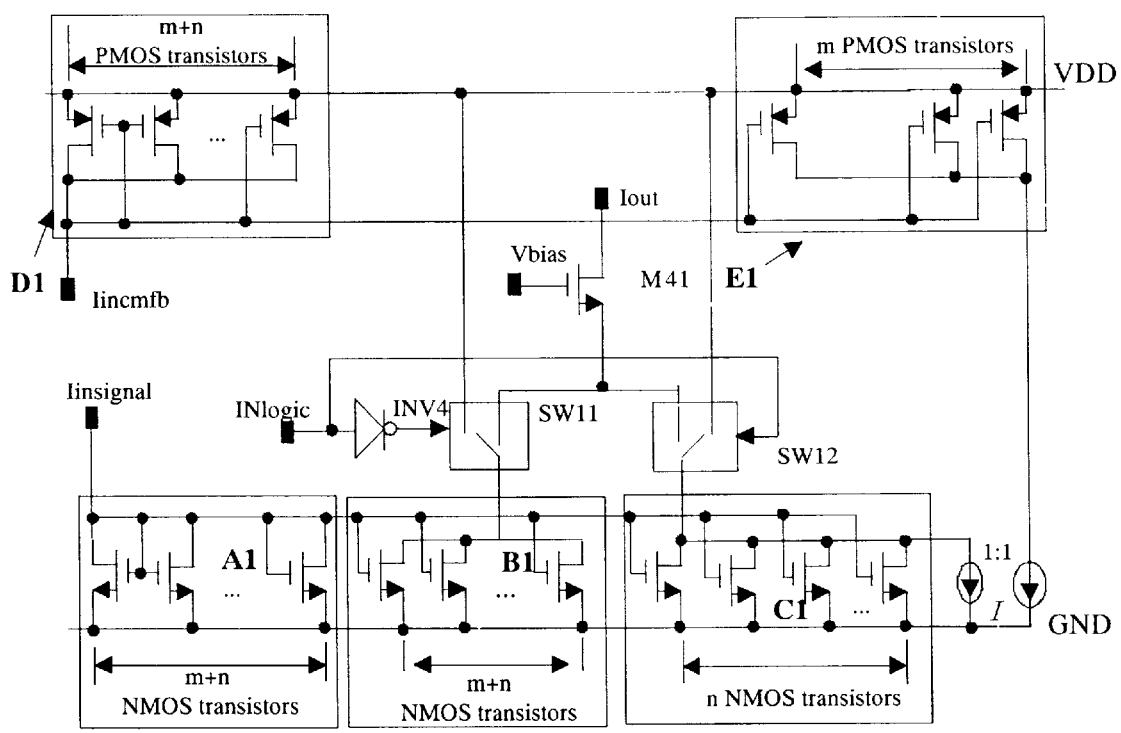
FIG. 8 is a current attenuation circuit diagram with P trap technology.

FIG. 8 shows a current attenuation circuit of P trap technology, which contains: MOS switches SW11 and SW12, an inverter INV4, a MOS transistor M41 and a current mirror I; an area A1 consisted of (m+n) NMOS transistors connected in parallel, it grids and drains are connected together; an area B1 consisted of (m+n) NMOS transistors connected in parallel, it drains are connected to the source of MOS transistor M41 across the MOS switch SW11; an area C1 consisted of n NMOS transistors connected in parallel, it drains are connected with the output of current mirror I; grid of areas A1, B1 and C1 are all connected to a input Iinsignal, source of areas A1, B1 and C1 are all connected to the ground GND; an area D1 consisted of (m+n) PMOS transistors connected in parallel, it grids and drains are mutually connected; an area E1 consisted of m PMOS transistors connected in parallel, it drains are connected to the input of the current mirror I; grid of areas D1 and E1 are all connected to common mode signal input Iincmfb, source of areas D1 and E1 are all connected to power supply VDD; MOS switch SW12 is connected between the source of MOS transistor M41 and drain of area C1; the third end of switches SW11 and SW12 are all connected to the power supply VDD; the control end of MOS switch SW12 and the input of inverter INV4 are all connected to the digital control signal INlogic; the output of inverter INV4 is connected to the control end of MOS switch SW11; the output of the MOS transistor M41, it grid is connected to bias voltage Vbias, is the current output Iout.

In FIG. 8, the circuit is divided into five areas A1, B1, C1, D1, and E1. Areas D1 and E1 constitute common mode feedback current attenuation stage, areas A1 and B1 constitute signal current copy stage and areas C1 and A1 constitute signal current attenuation stage. The area D1 is consisted of (m+n) PMOS transistors connected in parallel, with a common source, a common grid and a common drain. The area E1 is consisted of m PMOS transistors connected in parallel, with a common source, a common grid and a common drain. Areas A1 and B1 are consisted of (m+n) NMOS connected in parallel, with a common source, a common grid and a common drain. The area C1 is consisted of n NMOS transistors connected in parallel, with a common source, a common grid and a common drain. The Iincmfb is a common mode feedback current input, the Iinsignal is a signal input, the INlogic is a step gain digital control input, the Vbias is bias voltage and Iout is current output.

The common mode feedback input Iincmfb is a DC current, and the signal input Iinsignal is DC current $I_{DC}$ plus AC current $I_{AC}$. In general, the DC component of common mode feedback input equals to the DC component of signal input, and the bias voltage Vbias decreases effectively the MOS transistor channel length modulate effect.

Suppose current of common mode feedback input is:

$$Iincmfb = I_{DC}$$

Suppose current of signal input is:

$$Iinsignal = I_{DC} + I_{AC}$$

For areas D1 and E1, there is (m+n) and m PMOS transistors, respectively, because all the grids are connected together, so each PMOS transistor passes the same current. For area D1, the total current of (m+n) transistors is Iincmfb, so each transistor current is Iincmfb/m+n. In area E1, drains of m transistors are connected together, as single transistor current is same as device in area A1, so total current of m PMOS transistors, i.e. current cut in 1:1 current mirror I, is:

$$I_{SW2(cmfb)} = \frac{m}{m+n} * I_{INcmfb} = \frac{m}{m+n} * I_{DC}$$

Wherein, m is the number of PMOS transistors in area E1, (m+n) is the number of PMOS transistors in area D1. It can be seen from the formula above, common mode feedback current cut in current mirror is a proportional relationship with ratio of transistor number in areas D1 and E1.

It is same for current cut in switch SW11, which relates only numbers of NMOS transistors in areas A1 and B1. With the similar analysis as above, current cut in switch SW11 is:

$$I_{SW1} = \frac{m+n}{m+n} * I_{INsignal} = I_{INsignal}$$

Current cut in switch SW12 is:

$$I_{SW2} = \frac{n}{m+n} * I_{INsignal} + \frac{m}{m+n} * I_{DC} = I_{DC} + \frac{n}{m+n} * I_{INsignal}$$

When digital attenuation control signal is 0, switch SW11 directly conducts current $I_{SW1}$ to Iout, and switch SW12 directly conducts current $I_{SW2}$ to power supply. Therefore, current at output Iout is:

$$Iout = I_{INsignal}$$

It can be seen at this moment, that output current is equal to input signal current, i.e. current attenuation is 0 DB.

When digital attenuation control signal is 1, switch SW11 conducts directly current $I_{SW1}$ to power supply VDD, and switch SW12 conducts current $I_{SW2}$ to output Iout, $$Iout = I_{DC} + \frac{n}{m+n} * I_{AC}$$

From the analysis above, in an attenuation control circuit, attenuation of AC signal is n/(m+n), and DC signal keeps unchanged. In a cascade gain control circuit, each stage attenuates AC signal and keeps DC component unchanged. The attenuation of AC signal is n/(m+n), where n and m is a number of transistors. By using the match of n transistors and m transistors, a current effective attenuation is obtained. In this way, an integral problem of match is solved effectively.

In the analysis above, suppose DC component of common mode feedback input current and signal input current is the same, but in real circuit, there may be some difference between them. Besides, small variance of DC component may be come from mismatch of PMOS transistor and NMOS transistor. The total deviation of DC component can be expressed as:

$$\Sigma \Delta I_{DC} = \Delta I_{DC} + \Delta \left(\frac{m}{m+n}\right) * I_{DC}$$

Small variance of these two DC components only affects working point of a circuit without producing distortion of an AC signal. Therefore, in the circuit, match requirement of MOS transistors is only affected by gain control accuracy.

Figure 9:
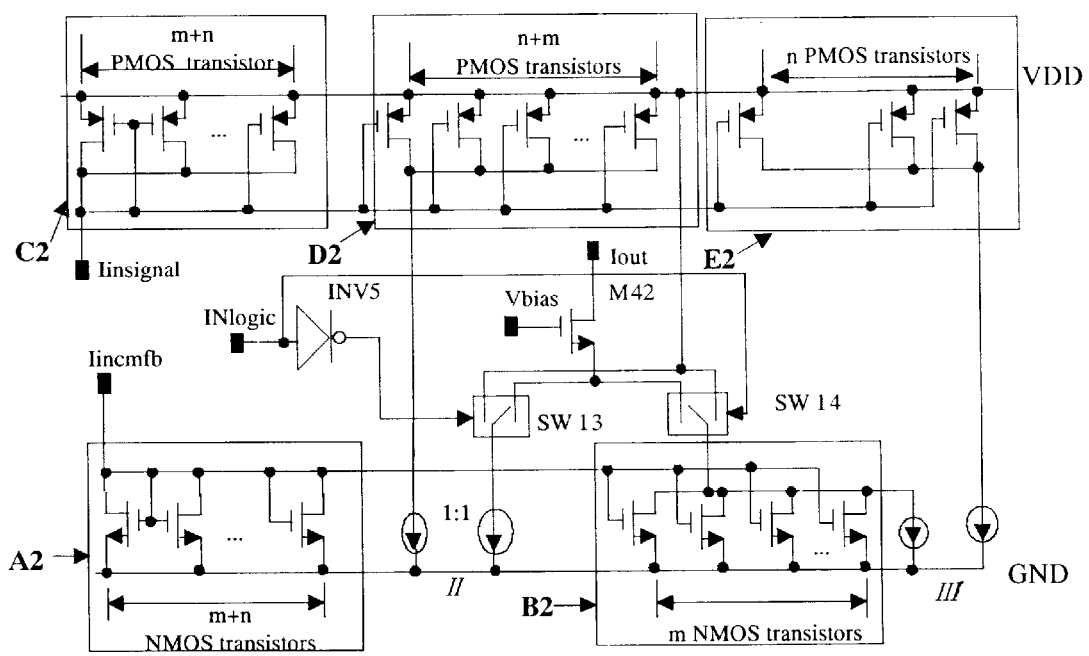
FIG. 9 is a current attenuation circuit diagram with N trap technology.

In N trap technology, using PMOS transistor to transform signal can also implement step attenuation control. FIG. 9 shows a current attenuation circuit, with N trap technology, which contains: MOS switches SW13 and SW14, an inverter INV5, a MOS transistor M42 and current mirrors II and III. There is an area C2 that is consisted of (m+n) PMOS transistors connected in parallel, it grids and drains are connected together. There is an area D2 that is consisted of (m+n) PMOS transistors connected in parallel, it drains are connected to input of the current mirror II. There is an area E2 that is consisted of n PMOS transistors connected in parallel, it drains are connected to input of the current mirror III. Grids of areas C2, D2 and E2 are all connected to signal input Iinsignal, sources of areas C2, D2 and E2 are all connected to power supply VDD. There is an area A2 that is consisted of (m+n) NMOS transistors connected in parallel, it grids and drains are connected together. There is an area B2 that is consisted of m NMOS transistors connected in parallel, it drains are connected to output of the current mirror III. Grids of areas A2 and B2 are all connected to common mode signal input Iincmfb, and sources of areas A2 and B2 are all connected to ground GND. The MOS switch SW13 is connected between source of the MOS transistor M42 and the current mirror II, and The MOS switch SW14 is connected between source of the MOS transistor M42 and drains of the area B2. The third end of MOS switches SW13 and SW14 is connected to power supply VDD, and the control end of MOS switch SW14 and input of the inverter INV5 are connected to digital control signal INlogic. The output of inverter INV5 is connected to the control end of MOS switch SW13; and the drain of MOS transistor M42, it grid is connected to the bias voltage Vbias, is the current output Iout.

Referring to FIG. 9, step attenuation control circuit is divided into five areas (or modules): A2, B2, C2, D2 and E2. Areas A2 and B2 constitute common mode feedback current attenuation stage. Areas C2 and D2 constitute signal current copy stage. Areas c2 and E2 constitute signal current attenuation stage. The area A2 is consisted of (m+n) NMOS transistors, connected in parallel, with a common source, a common grid and a common drain. The area B2 is consisted of m NMOS transistors, connected in parallel, with a common source, a common grid and a common drain. Areas C2 and D2 are consisted of (m+n) PMOS transistors, connected in parallel, with a common source, a common grid and a common drain, respectively. The area E2 is consisted of n PMOS transistors, connected in parallel, with a common source, a common grid and a common drain. Iincmfb is a common mode feedback current input, Iinsignal is a signal input, INlogic is a step gain digital control signal input, Vbias is a bias voltage and Iout is a current output.

With the same analysis as above, it is obtained that when INlogic=0, output current is:

$$I_{out}=I_{DC}+I_{AC}=I_{INsingal}$$

It can be seen from the formula above, output AC signal current is equal to input current, i.e. attenuation is 0 DB.

When digital gain control signal INlogic=1, output current is:

$$I_{out} = I_{DC} + \frac{n}{m+n} * I_{AC}$$

Similarly, from the formula above, signal attenuation is n/(m+n).

Figure 10:
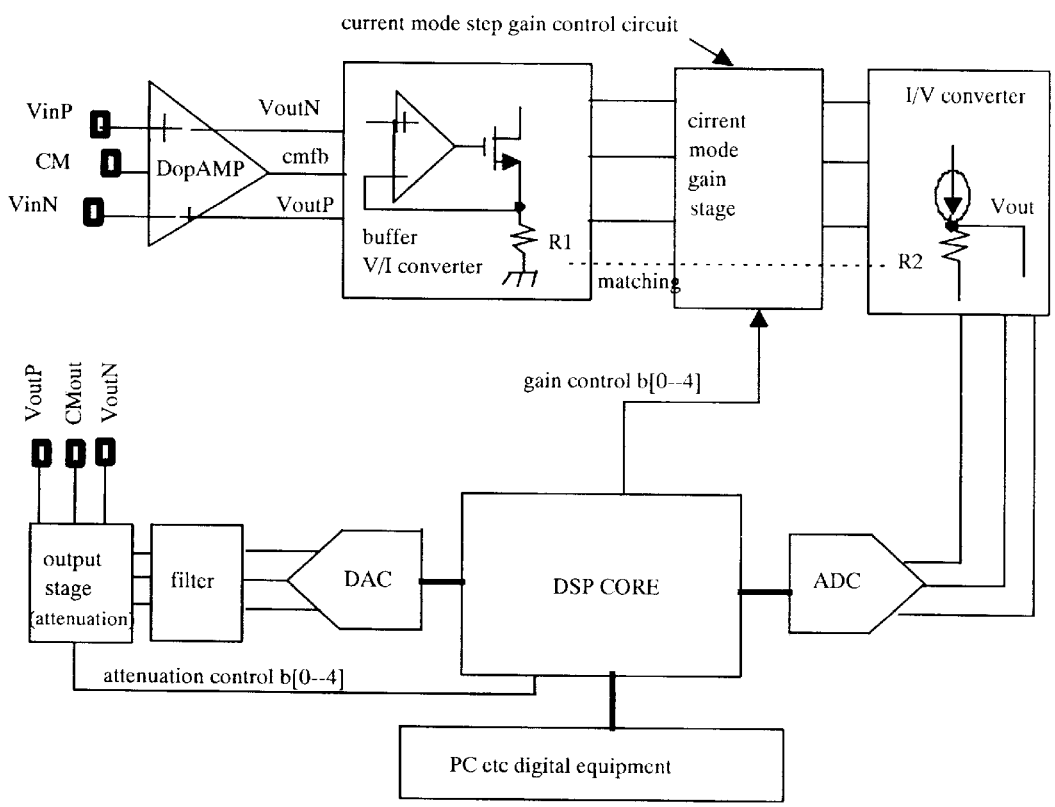
FIG. 10 is a typical application diagram.

FIG. 10 shows a typical application example of the invention. In general, there are peripherals, such as ADC and DAC etc., used as interface for DSP. In order to raise system resolution, at receiving end, automatic gain control circuit (AGC) is set in front of ADC to adjust signal amplitude. At transmission end, in order to decrease interference to adjacent channels, a step attenuation circuit is set after DAC to adjust output signal amplitude. In a communication system, a multimedia system or other digital-analogy mixed system, when SOC technology is used for integration, a technology used to manufacture digital integrated circuit is generally used to integrate AGC and ADC circuit. Manufacturing technology of the step attenuation control circuit of the invention is compatible with typical digital integrated circuit manufacturing technology, so DSP and step attenuation control circuit can be integrated on one chip to decrease system cost and increase system reliability effectively.

In data communication system, step attenuation control circuit can be used in fields such as ADSL, VDSL and video band transmission etc.

In FIG. 10, an analog input signal is inputted from VinP and VinN, and CM is a common mode voltage input used to adjust circuit working point. After passing a full differential operational amplifier DopAMP, the three input signal are converted from voltage to current. The current signals enter a current mode gain control stage to adjust gain, then the amplified signals are converted from current to voltage. The voltage signals are outputted to ADC by three lines to convert from analogy to digital, and the digital signal enters DSP to have necessary processing. When DSP determines that ADC converting accuracy is unsatisfied, it uses BUS gain control b[0–4] to adjust amplification multiple of current mode gain stage until it is satisfied. DSP can output the processed signal such as image data to some peripheral digital equipment such PC etc., and DSP can also output another digital signal to DAC to convert to an analog output signal, such as stereo audio signal etc. The DAC output, after filtering, is connected to an output stage to have a power output. In order to suppress interference of the power amplifier output to adjacent channel, DSP will attenuate the signal according to the channel characteristics, and then sends the attenuated signal to power amplifier.

Figure 5:
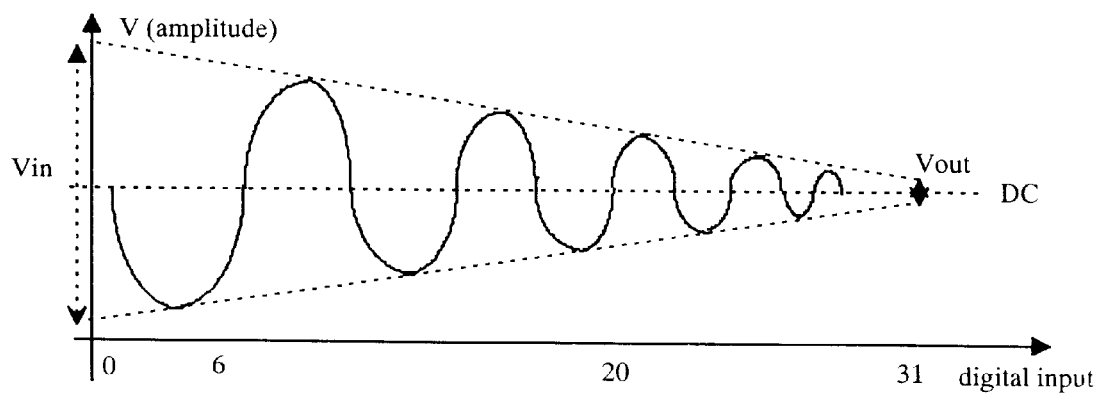
FIG. 5 is a corresponding relationship diagram of digital attenuation control input and sine waves output.

FIG. 5 shows relationship between digital control signal and attenuation, wherein sine waves are simplified. When a digital input is 0, an output equals the input, and the attenuation is 0 DB. When a digital input signal is 31, an output sine wave corresponding to the input sine wave is 0.0282, i.e. −31 DB. It can be seen from FIG. 5 that the signal attenuated is only the AC component, and the DC component is unchanged. Therefore, the purpose of only amplifying AC component without isolating capacitor is obtained. Consequently, circuits can be directly coupled with later stages. At the same time, as current mode DC suppression circuit has wider bandwidth, so in a wider frequency domain, the DC component of a signal is effectively suppressed and the current mode CMRR has a stable value.

What is claimed is:

1. A current mode step attenuation control circuit, comprising:
   a plurality of current attenuation circuit stages, wherein each of said current attenuation circuit stages are configured in a serial connection;
   a plurality of digital control inputs, each received by a corresponding one of said plurality of current attenuation circuit stages, wherein each of said digital control inputs is in electrical communication with a respective digital control signal;
   a plurality of common mode feedback signal inputs, each received by a corresponding one of said plurality of current attenuation circuit stages, wherein each of said common mode feedback signal inputs receives a respective common mode feedback current;
   a plurality of bias inputs, each receiving a bias voltage, and each received by a corresponding one of said plurality of current attenuation circuit stages; and
   an analog input signal connected to an input of the first stage of current attenuation circuit,
   wherein the attenuation of the control circuit is directly controlled by a digital signal.

2. The current mode step attenuation control circuit of claim 1, wherein the attenuation control circuit comprises a transistor which conducts resistance to form one of an equivalent resistance and current source match, to control attenuation.

3. The current mode step attenuation control circuit of claim 2, wherein the transistor comprises a MOS transistor.

4. The current mode step attenuation control circuit of claim 2, wherein said control circuit is compatible with digital integrated circuit technology.

5. The current mode step attenuation control circuit of claim 2, wherein the current mode step attenuation control circuit is integrated with a digital signal processor on one integrated chip.

6. The circuit according to claim 1, wherein the plurality of current attenuation circuit stages comprise 2 to 6 current attenuation circuit stages.

7. The circuit according to claim 1, wherein the plurality of current attenuation circuit stages comprise 5 current attenuation circuit stages.

8. The circuit according to claim 2, further comprising terminals associated with the digital control input, common mode feedback signal input, bias input, and analog input signal, and terminals associated with a signal output and a power supply.

9. The current mode step attenuation control circuit of claim 2, further comprising a first operational amplifier, wherein said first operational amplifier and said transistor comprise a first voltage follower.

10. The current mode step attenuation control circuit of claim 9, further comprising a second operational amplifier and a second transistor, wherein said second operational amplifier and said second transistor comprise a second voltage follower.

11. A current mode step attenuation control circuit, comprising:
    a plurality of current attenuation circuit stages, wherein each of said current attenuation circuit stages are serially connected;
    a digital control input, wherein said digital control input inputs a digital control signal to each attenuation stage;
    a common mode feedback signal input, wherein said common mode feedback signal input is connected with a common mode feedback current of each attenuation stage;
    a bias input, in communication with each current attenuation circuit stage, where said bias input is connected with a bias voltage; and
    an analog input signal connected to input of the first stage of current attenuation circuit.

12. The circuit according to claim 11, wherein the plurality of current attenuation circuit stages comprise 2 to 6 current attenuation circuit stages.

13. The circuit according to claim 11, wherein the plurality of current attenuation circuit stages comprise 5 current attenuation circuit stages.

14. The circuit according to claim 11, further comprising terminals associated with the digital control input, common mode feedback signal input, bias input, and analog input signal, and terminals associated with a signal output and a power supply.

15. The circuit according to claim 14, further comprising at least a first MOS transistor and a first operational amplifier configured to implement a first voltage follower, and at least a second MOS transistor and a second operational amplifier configured to implement a second voltage follower, where the source and drain of at least one other MOS transistor connects to a source of a set of a plurality of parallel PMOS transistors.

16. The circuit according to claim 15, wherein the current attenuation circuit further comprises a plurality of switches, wherein at least one of said plurality of switches is in electrical communication with said digital control input.

17. The circuit according to claim 16, wherein the at least one of said plurality of switches is in electrical communication with an output of an inverter at a control end of said at least one of said plurality of switches.

18. The circuit according to claim 15, further comprising at least a third transistor and a third operational amplifier, wherein said at least a third transistor and a third operational amplifier comprise a third voltage.

19. The circuit according to claim 14, wherein the current attenuation circuit comprises:
    a first module comprising m+n parallel NMOS transistors, and a grid and drain, wherein the grid and drain of the first module connect to each other;
    a second module comprising m+n parallel NMOS transistors, and a drain, wherein a MOS switch connects the drain of the second module to a MOS transistor;

a third module comprising n parallel NMOS transistors, and a grid and drain, where a drain of the third module connects to output of a current mirror, where grids of the first, second and third modules connect to the signal input, and sources of the first, second and third modules all connect to a power supply GND;

a fourth module comprising m+n parallel PMOS transistors, and a grid and drain, wherein the grid and drain of the fourth module connect to each other;

a fifth module comprising m parallel PMOS transistors and a drain and grid, where the drain of the fifth module connects to input of the current mirror, the grids of the fourth and fifth modules connect to the common mode feedback signal input, and the sources of the fourth and fifth modules connecting to the power supply VDD;

wherein at least one of a plurality of MOS switches crosses between a MOS transistor and drain of the third module, the third end of each MOS switch connects to the power supply VDD, a control end of at least one MOS switch and an input of the inverter connect to the digital control input, the output of the inverter connects to control end of a MOS switch, and the grid of the MOS transistor connecting to the bias voltage and drain of the MOS transistor comprise the signal output.

* * * * *